United States Patent
Bleckmann et al.

(10) Patent No.: US 9,672,994 B2
(45) Date of Patent: Jun. 6, 2017

(54) DEVICE FOR OPERATING MULTIPLE FUNCTIONS IN A MOTOR VEHICLE

(71) Applicant: Leopold Kostal GmbH & Co. KG, Luedenscheid (DE)

(72) Inventors: Michael Bleckmann, Schwerte-Ergste (DE); Corinna Machatzke, Schalksmuehle (DE)

(73) Assignee: Leopold Kostal GmbH & Co. KG, Luedenscheid (DE)

( * ) Notice: Subject to any disclaimer, the term of this patent is extended or adjusted under 35 U.S.C. 154(b) by 100 days.

(21) Appl. No.: 14/881,205

(22) Filed: Oct. 13, 2015

(65) Prior Publication Data
US 2016/0035504 A1    Feb. 4, 2016

Related U.S. Application Data

(63) Continuation of application No. PCT/EP2014/057323, filed on Apr. 10, 2014.

(30) Foreign Application Priority Data

Apr. 13, 2013 (DE) .................. 10 2013 006 414

(51) Int. Cl.
*H01H 37/06* (2006.01)
*H01H 3/02* (2006.01)
(Continued)

(52) U.S. Cl.
CPC ........... *H01H 3/0213* (2013.01); *B60K 37/06* (2013.01); *H01H 3/122* (2013.01); *H01H 23/24* (2013.01);
(Continued)

(58) Field of Classification Search
CPC ...... H01H 3/0213; H01H 23/24; H01H 25/06; H01H 2003/008; H01H 13/705;
(Continued)

(56) References Cited

U.S. PATENT DOCUMENTS

| 5,387,261 A | 2/1995 | Yamada et al. |
| 8,957,867 B2 | 2/2015 | Dietz et al. |

(Continued)

FOREIGN PATENT DOCUMENTS

| DE | 102008034603 B3 | 9/2009 |
| DE | 102008036155 A1 | 2/2010 |

(Continued)

OTHER PUBLICATIONS

European Patent Office, International Search Report for International Application No. PCT/EP2014/057323 mailed Jul. 21, 2014.
(Continued)

*Primary Examiner* — Edwin A. Leon
*Assistant Examiner* — Ahmed Saeed
(74) *Attorney, Agent, or Firm* — Brooks Kushman P.C.

(57) ABSTRACT

A device for operating multiple functions includes an operating element and a base. The base has side bearings with guide slots, hinge joints with pivot pins, and an actuator. The operating element is mounted in the guide slots to pivotably be mounted to the side bearings about an axis of rotation to thereby be movable between positions. At least one of the positions is assigned to a switching function. The operating element is mounted to the base on a centered bearing between the side bearings. The operating element is supported on the pivot pins. Upon the operating element being actuated to trigger a switching function, the actuator produces a haptic feedback by generating an actuating force on the operating element which causes the pivot pins to pivot in a direction parallel to the axis of rotation thereby causing the operating element to axially displace along this same direction.

19 Claims, 4 Drawing Sheets

(51) Int. Cl.
*H01H 3/12* (2006.01)
*B60K 37/06* (2006.01)
*H01H 23/24* (2006.01)
*H01H 25/06* (2006.01)
*H03K 17/96* (2006.01)
*H01H 3/00* (2006.01)

(52) U.S. Cl.
CPC ........... *H01H 25/06* (2013.01); *H03K 17/962* (2013.01); *B60K 2350/1036* (2013.01); *H01H 2003/008* (2013.01); *H01H 2003/0293* (2013.01); *H01H 2239/074* (2013.01); *H03K 2217/96062* (2013.01)

(58) Field of Classification Search
CPC .... H01H 13/14; H01H 13/7006; H01H 13/83; H01H 2003/0293
USPC ................. 200/5 A, 341–344, 600, 6 A, 6 R
See application file for complete search history.

(56) References Cited

U.S. PATENT DOCUMENTS

| | | | |
|---|---|---|---|
| 2005/0237306 A1* | 10/2005 | Klein | G06F 3/016 345/168 |
| 2009/0301852 A1 | 12/2009 | Keist et al. | |
| 2011/0291975 A1 | 12/2011 | Dietz et al. | |
| 2012/0199459 A1 | 8/2012 | Reise | |
| 2014/0034468 A1* | 2/2014 | Krumpelman | H01H 3/122 200/5 A |
| 2016/0035503 A1* | 2/2016 | Bleckmann | H01H 3/122 200/4 |

FOREIGN PATENT DOCUMENTS

| | | |
|---|---|---|
| DE | 102008058568 A1 | 5/2010 |
| DE | 102009032634 A1 | 1/2011 |
| DE | 102010024776 A1 | 12/2011 |
| EP | 2372915 A1 | 10/2011 |
| EP | 2509087 A1 | 10/2012 |
| WO | 2007053966 A2 | 5/2007 |
| WO | 2010094984 A1 | 8/2010 |
| WO | 2014167075 A1 | 10/2014 |
| WO | 2014167076 A1 | 10/2014 |

OTHER PUBLICATIONS

The International Bureau of WIPO, International Preliminary Report on Patentability for International Application No. PCT/EP2014/057323 issued Oct. 13, 2015.

* cited by examiner

DEVICE FOR OPERATING MULTIPLE FUNCTIONS IN A MOTOR VEHICLE

CROSS-REFERENCE TO RELATED APPLICATIONS

This application is a continuation of International Application No. PCT/EP2014/057323, published in German, with an International filing date of Apr. 10, 2014, which claims priority to DE 10 2013 006 414.7, filed Apr. 13, 2013; the disclosures of which are hereby incorporated in their entirety by reference herein.

TECHNICAL FIELD

The present invention relates to a device for operating multiple functions in a motor vehicle, the device having an operating element pivotably mounted about an axis of rotation to be thereby movable between at least two positions with at least one of the positions being associated with a switching function, whereby different functions can be triggered by manually actuating the operating element and the operating element produces a haptic feedback upon being actuated.

BACKGROUND

DE 10 2010 024 776 A1 describes a device having an operating element pivotably mounted about an axis of rotation. The operating element can be in the form of a switching strip having capacitive sensor surfaces. Switching components or switch contacts can be actuated with the switching strip being swiveled to thereby cause switching functions to trigger. The triggered switching functions correspond to the actuated switching components or switch contacts. Actuation of the operating element results in a haptic or acoustic feedback. A clicking sound and a mechanical resistance occur during actuation of the operating element.

DE 10 2010 024 776 A1 thereby describes the functional principle of a device which combines touch sensitive and pressure actuatable contact switching elements. However, there are few details with respect to an advantageous mechanical design for such a device, especially with respect to precise execution and arrangement of switching elements and the implementation of a haptic feedback.

SUMMARY

An object includes a device for operating multiple functions in which the device has a simple, cost-effective mechanical design that is stable with low play and produces a haptic feedback in an advantageous manner.

In carrying out at least one of the above and/or other objects, a device for operating multiple functions is provided. The device includes an operating element and a base. The base has side bearings with guide slots, hinge joints with pivot pins, and an actuator. The operating element has rotational axle end sections mounted in the guide slots of the side bearings of the base, respectively, to pivotably be mounted to the base about an axis of rotation to thereby be movable between at least two positions, wherein at least one of the positions is assigned to a switching function. The operating element is further mounted to the base on a centered bearing between the side bearings of the base. The operating element is supported on the pivot pins of the hinge joints of the base. Upon the operating element being actuated to trigger a switching function, the actuator produces a haptic feedback by generating an actuating force on the operating element which causes the pivot pins of the hinge joints to pivot in a direction parallel to the axis of rotation thereby causing the operating element to axially displace along the direction parallel to the axis of rotation.

The base may further include a return spring and the operating element may further include a fixed stop plate. The return spring engages the fixed stop plate to spring bias the operating element to a resting position along the direction parallel to the axis of rotation. The actuator further produces the haptic feedback by removing the actuating force on the operating element which causes the operating element to axially move back in an opposite direction parallel to the axis of rotation to its resting position and causes the pivot pins of the hinge joints to pivot in the same opposite direction back to their resting position.

The operating element may further include a force sensor disposed between the operating element and one of the pivot pins of the base. The force sensor detects pressure forces pressing the operating element toward the base as the pressure forces cause the force sensor to press more against the one of the pivot pins. The force sensor detects tensile forces pulling the operating element away from the base as the tensile forces cause the force sensor to press less against the one of the pivot pins. The operating element may further include a receptacle. The force sensor is disposed between the receptacle and an end section of the one of the pivot pins. The device may further include a compression spring configured to pre-tension the operating element against the force sensor. The force sensor may be disk-shaped, function according to a capacitive principle, and/or function according to a piezoelectric principle.

The hinge joints may be ball joints.

The base and the operating element may each further include a respective centering wall section, which form the centered bearing.

The mounting of the operating element to the base on the centered bearing may limit mobility of the operating element relative to the base in a vertical direction perpendicular to the axis of rotation.

The operating element may form a switching strip having touch-sensitive capacitive sensor surfaces that trigger different functions through a manual actuation.

The operating element may include touch-sensitive capacitive sensor surfaces that trigger different functions through a manual actuation.

Further, in carrying out at least one of the above and/or other objects, a device for operating multiple functions in a vehicle is provided. The device includes an operating element and a base. The base has two side bearings with guide slots extending along a vertical axis, two hinge joints with pivot pins, and an electromagnetic actuator. The operating element is spaced apart from the base along the vertical axis. The operating element has rotational axle end sections floatingly mounted in the guide slots of the side bearings of the base, respectively, to pivotably be mounted to the base about an axis of rotation, perpendicular to the vertical axis, to thereby be movable between at least two positions. At least one of the positions is assigned to a switching function. The operating element is further mounted over the base in a centered manner relative to the vertical axis on a centered bearing between the side bearings of the base. The operating element is floatingly supported on the pivot pins of the hinge joints of the base. Upon the operating element being actuated to trigger a switching function, the actuator produces a haptic feedback by generating an actuating force on the operating element which causes the pivot pins of the hinge joints on which the operating element is supported to pivot in a direction parallel to the axis of rotation thereby causing the operating element to axially displace along the direction parallel to the axis of rotation.

An embodiment includes a device for operating multiple functions in a vehicle. The device includes an operating element and a base. The operating element and the base are spaced apart from one another along a vertical axis. The operating element is pivotably mounted to the base about an axis of rotation, perpendicular to the vertical axis, and can thereby be moved between at least two positions. At least one of the positions is associated with a switching function. The operating element includes first and second rotational axle end sections. The base includes first and second laterally spaced apart side bearings. Each side bearing includes an elongated hole (i.e., a guide slot) oriented along the vertical axis. The rotational axle end sections are mounted in the elongated holes of the side bearings, respectively, to pivotably mount the operating element to the base.

The operating element is further mounted over the base in a centered manner at a central mounting point relative to the direction of the vertical axis. The base further includes two laterally spaced apart hinge (e.g., pivot or swivel) joints. The hinge joints include respective pivot (e.g., hinge or swivel) pins extending along the vertical axis. The operating element is supported on the pivot pins of the hinge joints of the base.

Different functions can be triggered by manually actuating the operating element. The operating element produces haptic feedback upon being actuated. The haptic feedback is produced by an electromagnetic actuator which temporarily axially moves the operating element slightly in a direction parallel to the axis of rotation.

In order to produce the haptic feedback upon the operating element being actuated, the actuator generates an actuating force which acts on the operating element. The actuating force from the actuator acts on the operating element and causes the pivot pins of the hinge joints on which the operating element is supported to pivot in the direction parallel to the axis of rotation. The operating element axially moves in the direction parallel to the axis of rotation with the pivoting of the pivot pins of the hinge joints. The actuator then removes the actuating force. The operating element is spring biased to return to its resting position in the direction parallel to the axis of rotation. Thus, in the absence of the actuating force from actuator, the operating element axially moves back in an opposite direction parallel to the axis of rotation to its resting position. This causes the pivot pins of the hinge joints to pivot in the same opposite direction back to their resting position.

In embodiments, the rotational axle end sections of the operating element are mounted in two guide slots (i.e., the two elongated holes) respectively of the two side bearings arranged along a vertical axis, the operating element is mounted centered on a central bearing point with respect to the direction of the vertical axis, the operating element is supported on the pivot pins of the hinge joints extending along the vertical axis, and haptic feedback occurs through an electromagnetic actuator which, under the control of an electronic controller, temporarily displaces the operating element in the axial direction of the axis of rotation upon the operating element being actuated.

Embodiments enable an operating element, which can essentially be formed from a large surface area molding that is light, and thus has little inherent bending resistance, to be arranged so that it can be displaced and is likewise stable, nearly free of play, is almost frictionless, and is not tolerance sensitive.

This is achieved through a combination of a floating support of the operating element on the pivot pins of hinge joints, a vertically centered bearing of the operating element on a slot, and a floating pivot bearing of the operating element on two vertical guide slots. Furthermore, an electromagnetic actuator is provided that produces a haptic feedback when an operating function is triggered. The electromagnetic actuator produces the haptic feedback by temporarily displacing the operating element in the axial direction of its axis of rotation. A plunger solenoid magnet can be used as the actuator in combination with a return spring.

In embodiments, at least one of the pivot pins of the hinge joints is supported on a force sensor. The force sensor may be a disk-shaped sensor that functions according to a capacitive operating principle.

In embodiments, the operating element is pre-tensioned by spring force against the force sensor. By such means the force sensor can detect both compressive and tensile forces (i.e., both pushing and pulling forces) acting on the operating element and can thereby distinguish actuations of the operating element in two different directions.

In embodiments, the operating element is a switching strip having neighboring capacitive sensor surfaces and an integrated circuit (e.g., a printed circuit board).

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 5:
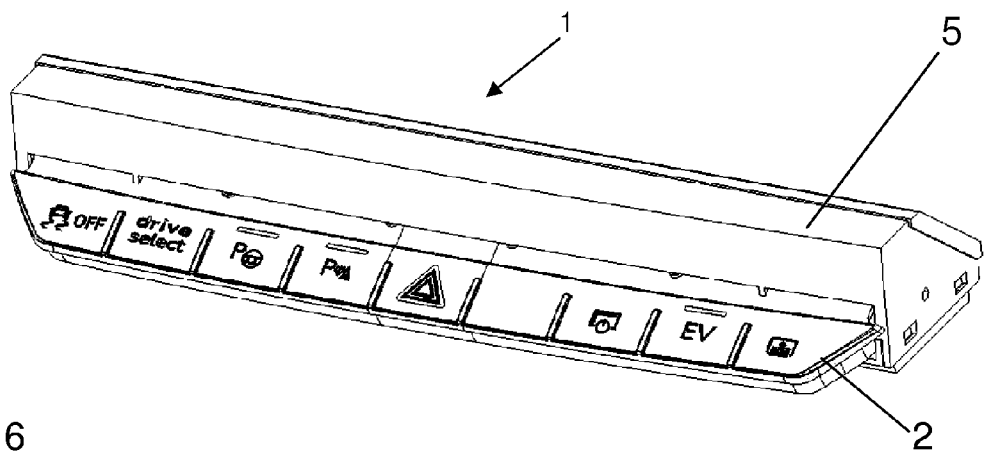
FIG. 5 illustrates a perspective view of an exemplary implementation of the device, the device being shown in an assembled state.
Figure 6:
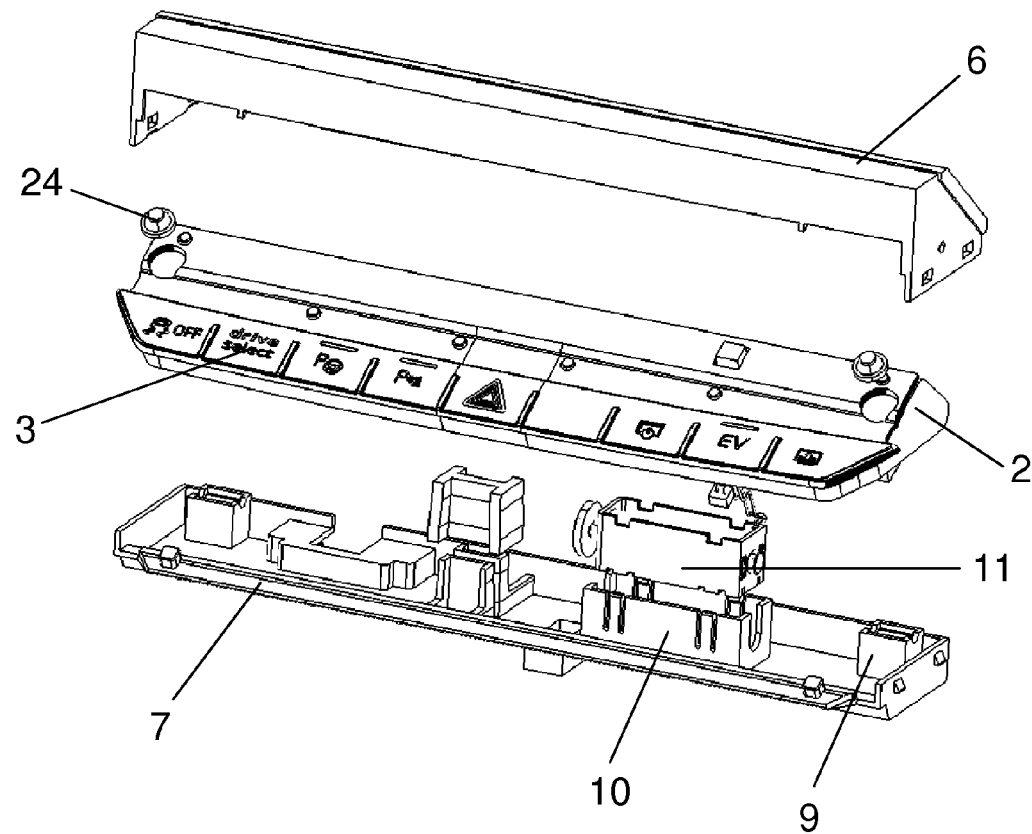
FIG. 6 illustrates an exploded view of the exemplary implementation of the device shown in FIG. 5, the device being shown in a disassembled state.
Figure 7:
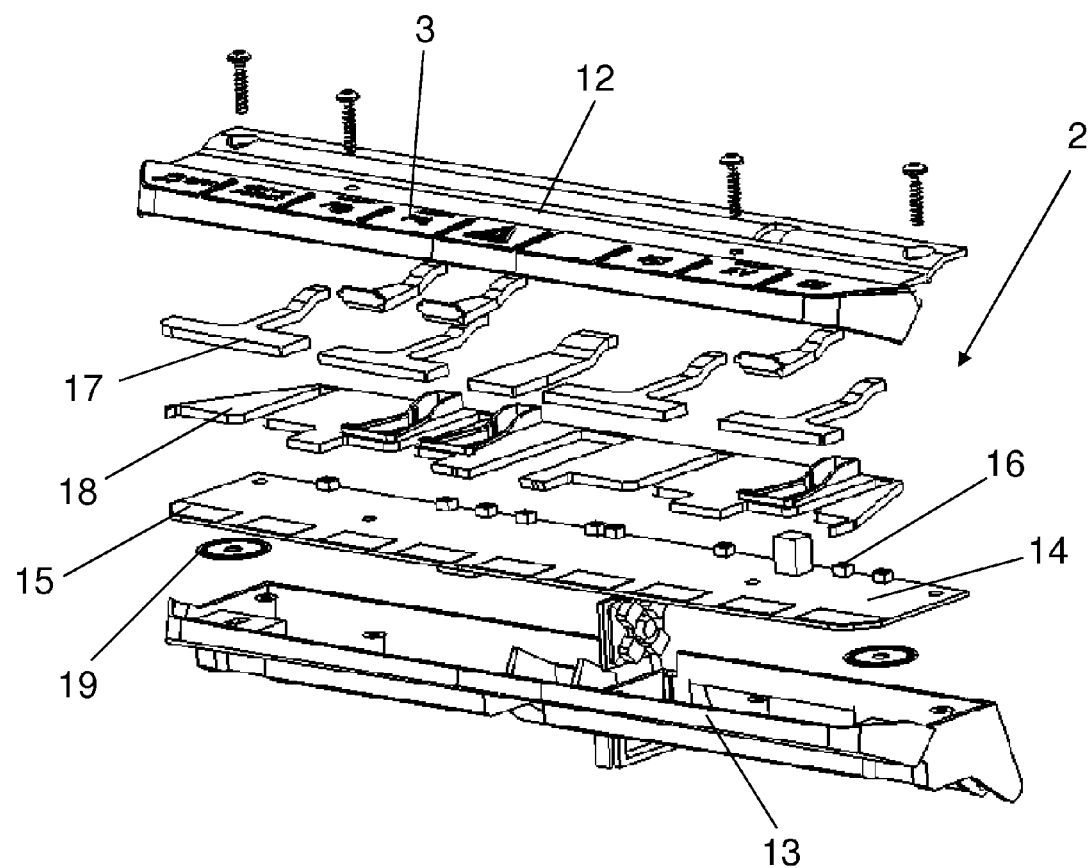
FIG. 7 is an exploded view of an operating element of the exemplary implementation of the device shown in FIG. 5, the operating element being shown in a disassembled state.

FIGS. 1, 2, 3, and 4 illustrate views of a basic depiction of a device 1 for operating multiple functions. FIGS. 5, 6, and 7 illustrate views of an exemplary implementation of device 1. As follows, FIGS. 5, 6, and 7 will be described ahead of FIGS. 1, 2, 3, and 4 being described.

Referring now to FIGS. 5, 6, and 7, with continual reference to FIGS. 1, 2, 3, and 4, an exemplary implementation of a device 1 for operating multiple functions will be described. FIG. 5 illustrates device 1 in an assembled state whereas FIG. 6 illustrates device 1 in a disassembled state prior to assembly. FIG. 7 illustrates an operating element 2 of device 1 in which the operating element is shown in a disassembled state prior to assembly.

Device 1 includes operating element 2 and a housing 5. Housing 5 includes an upper housing part 6 and a lower housing part 7. Operating element 2 is located between base 7 and an upper housing part 6. Lower housing part 7 is a base for operating element 2. Upper housing part 6 may be a housing shell.

Lower housing part 7 has an integrally molded centering element or center bearing point and two integrally molded side bearings 9 for operating element 2. Lower housing part 7 further includes a bracket 10 for an electromagnetic actuator 11. Actuator 11 is for causing a lateral displacement of operating element 2 relative to housing 5 (in particular, relative to lower housing part 7). Actuator 11 may be a solenoid magnet.

The internal layout of operating element 2 is shown in FIG. 7 in an exploded view. Operating element 2 includes a switching strip 12 and a switching strip support 13. Switching strip 12 includes a plurality of actuator (sensor) surfaces 3. Switching strip 12 is mounted on switching strip support 13. Operating element 2 further includes a printed circuit board (PCB) 14. PCB 14 is located between switching strip 12 and switching strip support 13. PCB 14 includes a series of capacitive sensor surfaces 15 placed thereon. Sensor surfaces 15 are respectively associated with actuator surfaces 3 on switching strip 12. PCB 14 further includes light sources 16 (e.g., LEDs) placed thereon. Operating element 2 further includes light conductors 17 and a visor body 18. Light from light sources 16 conducts over light conductors 17 and visor body 18 for illuminating symbolic displays on actuator surfaces 3.

Operating element 2 further includes one or more force sensors 19. Force sensors 19 are located underneath PCB 14. Force sensors 19 detect actuation forces (i.e., compressive and tensile forces) acting on operating element 2. Force sensors 19 may be disk-shaped and may operate according to a capacitive principle for detecting the actuation forces. In order to make a multiplicity of operating functions selectable, triggerable operating functions can be pre-selected by touching corresponding actuating surfaces 3 arranged on switching strip 12. The pre-selected operating function is then confirmed and triggered by pressure actuation of operating element 2.

Referring now to FIGS. 1, 2, 3, and 4, with continual reference to FIGS. 5, 6, and 7, a basic version of device 1 will be described. The design and manner of operation of device 1, and in particular the detection of an actuation force through force sensor(s) 19, will be explained in greater detail in the following with the aid of FIGS. 1, 2, 3, and 4 in generalized schematic illustrations. In FIGS. 1, 2, 3, and 4, operating element 2 is simplified as an operating bar 2, on which the electrical and electronic components have been eliminated in order to clarify the mechanism, and lower housing part 7 is simplified as a base plate 7 (i.e., base 7).

In order to make a simple comparison between the exemplary implementation of device 1 shown in FIGS. 5, 6, and 7 and the basic version of device 1 shown in FIGS. 1, 2, 3, and 4, the same reference numbers are used in all figures for the components that correspond to one another.

FIGS. 1, 2, 3, and 4 illustrate the positioning of operating bar 2 on base plate 7, which complies with the principle of the positioning of operating element 2 on lower housing part 7 in the exemplary implementation of device 1 shown in FIGS. 5, 6, and 7. Operating bar 2 is pivotably mounted about an axis of rotation 4 on base plate 7. For this purpose, pin-shaped rotational axle end sections 4a, 4b of operating bar 2 are movably guided in vertical guide slots 29 of respective side bearings 9 of base plate 7. As a result of the mounting of rotational axle end sections 4a, 4b of operating bar 2 to respective side bearings 9 of base plate 7, the position of operating bar 2 is determined with respect to the x-direction (of the x, y, z coordinate axes shown in FIG. 2).

Base plate 7 further includes a center bearing 8 located between guide slots 25 of side bearings 9. Centering wall sections 10, 11 tightly surround upper and lower sides of operating bar 2 on center bearing 8. Centering wall sections 10, 11 are oriented along vertical axis z. Centering wall sections 10, 11 are respectively formed by segments of housing parts 6, 7 or with housing parts 6, 7 and limit the mobility of operating element 2 in the vertical direction.

A displacement of operating element 2 axially along its longitudinal direction, and thus in the direction of axis of rotation 4 or along the y-direction of the coordinate system (of the x, y, z coordinate axes shown in FIG. 2), can be accomplished by electromagnetic actuator 11 (which is not shown in FIGS. 1, 2, 3, and 4, but is shown in FIG. 6).

A substitute for actuator 11 is a disengageable control element 25 that belongs to an actuator, which can exert a force on a stop plate 26 of operating element 2 and thereby axially displaces operating element 2 against the force of a return spring 27 with respect to base plate 7.

In order to enable this axial displacement motion of operating element 2 in a direction extending along axis of rotation 4, and to exclude tilting of operating bar 2 about a tilt axis perpendicular to axis of rotation 4, operating bar 2 is floatably supported on pivot pins 21 of hinge joints 20 of base plate 7. Free end sections 32 of pivot pins 21 are supported respectively in receptacles 23 formed on the surface of operating bar 2. Force sensors 19 are respectively disposed between free end sections 32 of pivot pins 21 and bearing (contact) surfaces of receptacles 23.

Figure 1:
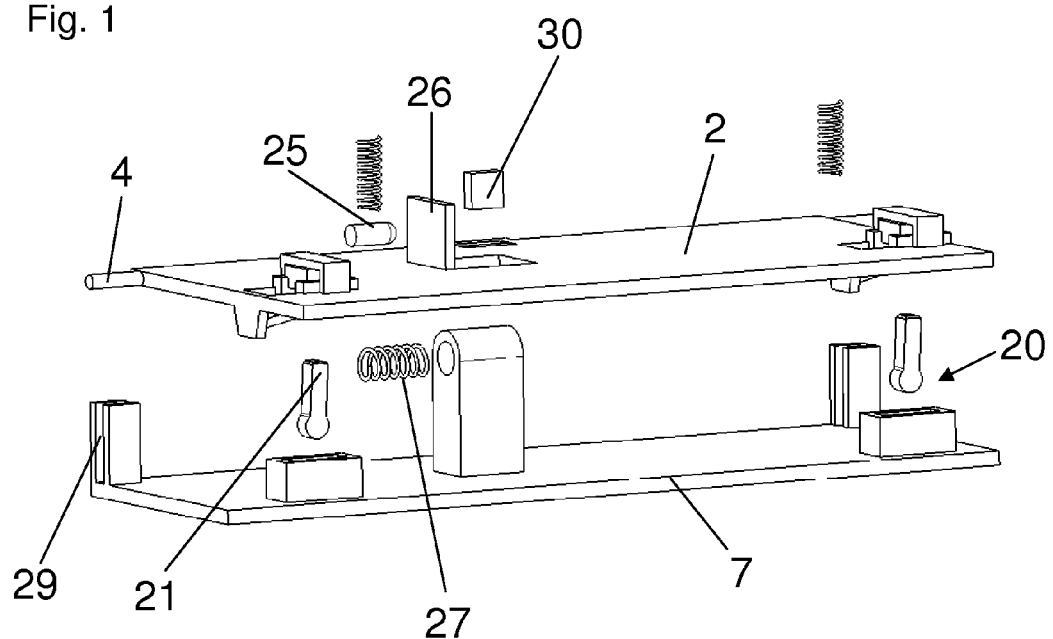
FIG. 1 illustrates an exploded view of a basic depiction of a device for operating multiple functions in accordance with embodiments of the present invention, the device being shown in a disassembled state.
Figure 2:
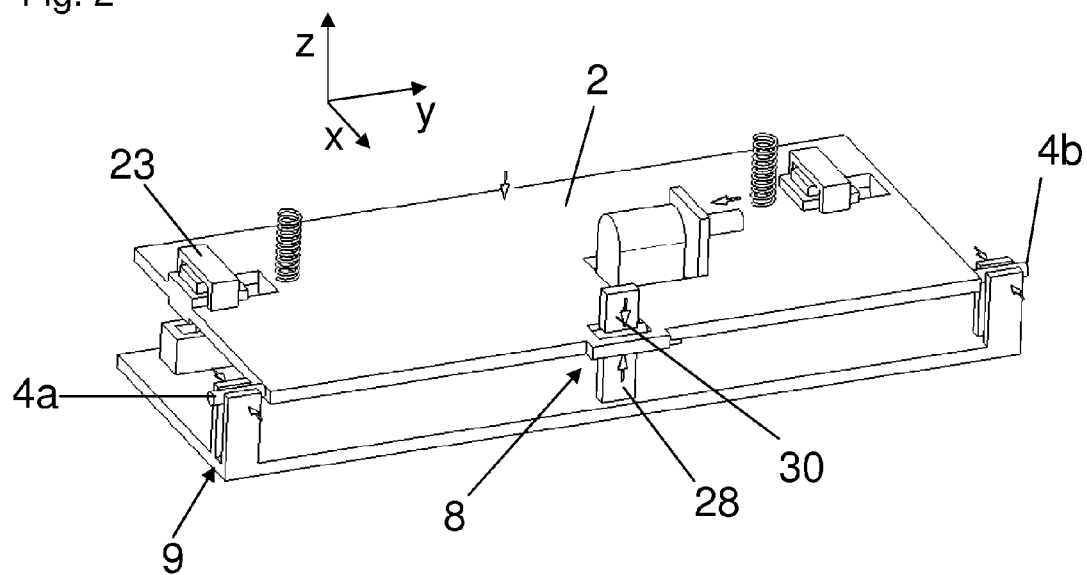
FIG. 2 illustrates a perspective view of the basic depiction of the device shown in FIG. 1, the device being shown in an assembled state.
Figure 3:
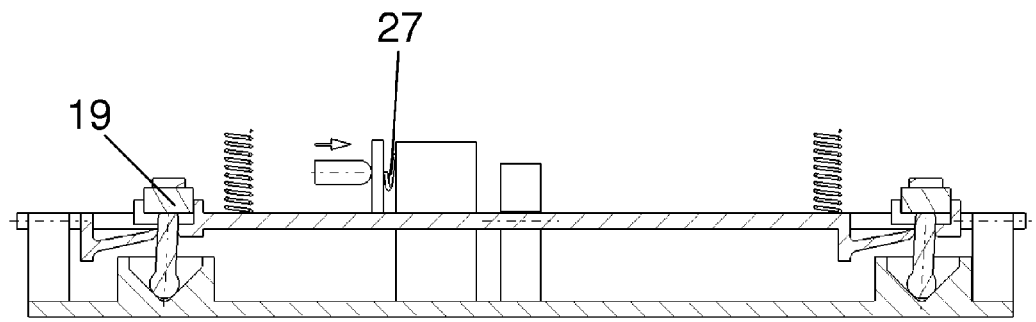
FIG. 3 illustrates a sectional view of the basic depiction of the device shown in FIGS. 1 and 2, the device being in a rest position axially along a direction extending along an axis of rotation of an operating element of the device.
Figure 4:
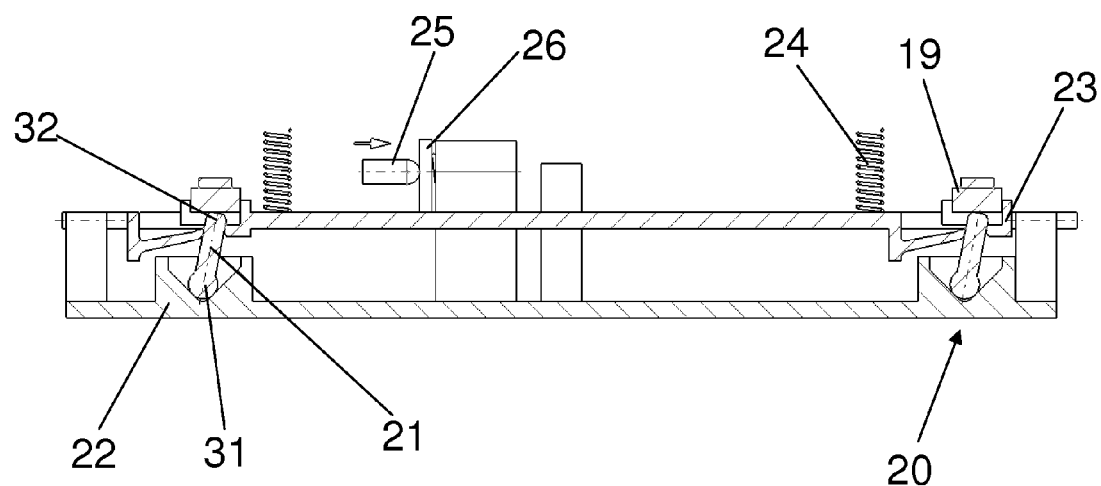
FIG. 4 illustrates a sectional view of the basic depiction of the device shown in FIGS. 1 and 2, the device being in a displaced position axially along the direction extending along an axis of rotation of the operating element of the device.

As best shown in the sectional views of FIGS. 3 and 4, each hinge joint 20 includes a pivot pin 21. Pivot pin 21 has a rounded end section 31 and free end section 32. Rounded end section 31 is received within a pivot bearing 22 of hinge joint 20. Rounded end section 31 can in particular be formed as spherical shape. Pivot pin 21 can be pivoted in pivot bearing 22 in a direction parallel to axis of rotation 4 (i.e., in the y direction). Free end section 32 of pivot pin 21 is supported in a respective receptacle 23 in the surface of operating bar 2.

Force sensors 19 are respectively disposed between free end sections 32 of pivot pins 21 and bearing (contact) surfaces of receptacles 23 of operating bar 2. Force sensors 19 may be disk-shaped. Force sensors 19 detect pressure forces acting on the surface of operating bar 2. Force sensors 19 detect the pressure forces as the pressure forces cause force sensors 19 to press against free end sections 32 of pivot pins 21.

Force sensors 19 also detect tensile forces that originate from operating bar 2 being lifted. One or more compression springs 24 are provided for this purpose. Compression springs 24 provide a biasing force against operating bar 2 toward base plate 7 and thereby press force sensors 19 against free end sections 32 of pivot pins 21. The pretension produced through compression springs 24 reduces the bearing play in operating bar 2.

Force sensors 19 also detect the rest position of operating bar 2 through this mechanical pretension. The pretension is increased when a compression pressure force is applied to operating bar 2 and is reduced when a tensile force is applied to operating bar 2. Pivoting actions of operating bar 2 can thereby be detected both downwardly (i.e., pushing) and upwardly (i.e., pulling), even without a form-fitting connection, by force sensors 19.

When a prescribed positive or negative force change threshold is exceeded, an electronic unit (not shown) triggers an operating function that corresponds to the actuation.

During the actuation of operating bar 2, electromagnetic actuator 11, controlled by the electronic unit, releases its control element 25 against stop plate 26 of operating bar 2. The release due to the positioning of operating bar 2 on hinge joints 20 causes a lateral displacement of operating bar 2 as shown in FIG. 4. It can be seen that pivot pins 21 are respectively pivoted with respect to their initial position shown in FIG. 3. If actuator 11 is not carrying a current, then return spring 27 that presses against stop plate 26 guides operating bar 2 back into the initial position. This short lateral displacement over a path of about a millimeter is not detected as a displacement by the user, but rather is sensed as a yielding of operating bar 2 and is thus well suited for generating a switching haptic feedback.

REFERENCE SYMBOLS 1 device
2 operating element (operating bar)
3 actuator (sensor) surfaces
4 axis of rotation
4a, 4b first and second rotational axle end sections
5 housing
6 upper housing part
7 lower housing part (base plate)
8 center bearing
9 side bearings
10 bracket
11 (electromagnetic) actuator
12 switching strip
13 switching strip support
14 printed circuit board
15 sensors
16 light sources
17 light conductor
18 visor body
19 force sensor(s)
20 hinge (pivot or swivel) joint(s)
21 pivot (hinge or swivel) pins
22 pivot bearing
23 seat
24 compression spring(s) (pretension element)
25 control (driving) element
26 stop plate
27 return spring
28 centering section
29 guide slots
30 centering section
31 (rounded) end sections
32 (free) end sections
x, y, z coordinate axes (directions)
x axis direction (perpendicular to axis of rotation and vertical axis)
y axis direction (parallel with axis of rotation)
z vertical axis While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A device for operating multiple functions, the device comprising:

a base having side bearings with guide slots, hinge joints with pivot pins pivotable about a pivot axis, and an electromagnetic actuator; and an operating element having rotational axle end sections mounted in the guide slots of the side bearings of the base, respectively, to rotatably be mounted to the base about an axis of rotation normal to the pivot axis to thereby be rotatable between at least two positions, wherein at least one of the positions is assigned to a switching function;

wherein the operating element is further mounted to the base on a centered bearing between the side bearings of the base, and the operating element is supported on the pivot pins of the hinge joints of the base;

wherein upon detection of the operating element rotating about the axis of rotation toward the base in response to being actuated by an external force to trigger a switching function, the actuator is triggered to produce a haptic feedback by generating an actuating force generated separately from the external force, in a direction parallel to the axis of rotation on the operating element which causes the pivot pins of the hinge joints to pivot about the pivot axis thereby causing the operating element to axially displace along the direction parallel to the axis of rotation.

2. A device for operating multiple functions, the device comprising:

a base having side bearings with guide slots, hinge joints with pivot pins pivotable about a pivot axis, and an actuator;

an operating element having rotational axle end sections mounted in the guide slots of the side bearings of the base, respectively, to rotatably be mounted to the base about an axis of rotation normal to the pivot axis to thereby be rotatable between at least two positions, wherein at least one of the positions is assigned to a switching function;

wherein the operating element is further mounted to the base on a centered bearing between the side bearings of the base, and the operating element is supported on the pivot pins of the hinge joints of the base;

wherein upon the operating element being actuated to trigger a switching function, the actuator produces a haptic feedback by generating an actuating force on the operating element which causes the pivot pins to pivot about the pivot axis thereby causing the operating element to axially displace along the direction parallel to the axis of rotation;

wherein the base further includes a return spring and the operating element further includes a fixed stop plate, wherein the return spring engages the fixed stop plate to spring bias the operating element to a resting position along the direction parallel to the axis of rotation; and wherein the actuator further produces the haptic feedback by removing the actuating force on the operating element which causes the operating element to axially move back in an opposite direction parallel to the axis of rotation to its resting position and causes the pivot pins of the hinge joints to pivot about the pivot axis back to their resting position.

3. The device of claim 1 wherein:
the operating element further includes a force sensor disposed between the operating element and one of the pivot pins of the base, the force sensor detects pressure forces pressing the operating element toward the base as the pressure forces cause the force sensor to press more against the one of the pivot pins, the force sensor detects tensile forces pulling the operating element away from the base as the tensile forces cause the force sensor to press less against the one of the pivot pins.

4. The device of claim 3 wherein:
the operating element further includes a receptacle, wherein the force sensor is disposed between the receptacle and an end section of the one of the pins.

5. The device of claim 3 further comprising:
a compression spring configured to pre-tension the operating element against the force sensor.

6. The device of claim 3 wherein:
the force sensor is disk-shaped.

7. The device of claim 3 wherein:
the force sensor functions according to a capacitive principle.

8. The device of claim 1 wherein:
the hinge joints are ball joints.

9. The device of claim 1 wherein:
the base and the operating element each further include a respective centering wall section which form the centered bearing.

10. The device of claim 1 wherein:
the mounting of the operating element to the base on the centered bearing limits mobility of the operating element relative to the base in a vertical direction perpendicular to the axis of rotation.

11. The device of claim 1 wherein:
the operating element forms a switching strip having a plurality of touch-sensitive capacitive sensor surfaces that trigger different functions through a manual actuation.

12. The device of claim 1 wherein:
the operating element further includes a plurality of touch-sensitive capacitive sensor surfaces that trigger different functions through a manual actuation.

13. A device for operating multiple functions in a vehicle, the device comprising:
a base having two side bearings with guide slots extending along a vertical axis, two hinge joints with pivot pins pivotable about a pivot axis normal to the vertical axis, and an electromagnetic actuator; and
an operating element spaced apart from the base along the vertical axis, the operating element having rotational axle end sections floatingly mounted in the guide slots of the side bearings of the base, respectively, to rotatably be mounted to the base about an axis of rotation normal to the vertical axis and normal to the pivot axis to thereby be rotatable between at least two positions, wherein at least one of the positions is assigned to a switching function;
wherein the operating element is further mounted over the base in a centered manner relative to the vertical axis on a centered bearing between the side bearings of the base, and the operating element is floatingly supported on the pivot pins of the hinge joints of the base;
wherein upon the operating element being actuated to trigger a switching function, the actuator produces a haptic feedback by generating an actuating force on the operating element which causes the pivot pins of the hinge joints on which the operating element is supported to pivot about the pivot axis thereby causing the operating element to axially displace along the direction parallel to the axis of rotation;
wherein the base further includes a return spring and the operating element further includes a fixed stop plate, wherein the return spring engages the fixed stop plate to spring bias the operating element to a resting position along the direction parallel to the axis of rotation;
wherein the actuator further produces the haptic feedback by removing the actuating force on the operating element which causes the operating element to axially move back in an opposite direction parallel to the axis of rotation to its resting position and causes the pivot pins of the hinge joints to pivot about the pivot axis back to their resting position.

14. The device of claim 13 wherein:
the operating element further includes a force sensor disposed between the operating element and one of the pivot pins of the base, the force sensor detects pressure forces pressing the operating element toward the base as the pressure forces cause the force sensor to press more against the one of the pivot pins, the force sensor detects tensile forces pulling the operating element away from the base as the tensile forces cause the force sensor to press less against the one of the pivot pins.

15. The device of claim 14 wherein:
the operating element further includes a receptacle, wherein the force sensor is disposed between the receptacle and an end section of the one of the pins.

16. The device of claim 14 further comprising:
a compression spring configured to pre-tension the operating element against the force sensor.

17. The device of claim 13 wherein:
the hinge joints are ball joints.

18. The device of claim 13 wherein:
the base and the operating element each further include a respective centering wall section which form the centered bearing; and
the mounting of the operating element to the base on the centered bearing limits mobility of the operating element relative to the base in a vertical direction perpendicular to the axis of rotation.

19. The device of claim 13 wherein:
the operating element forms a switching strip having a plurality of touch-sensitive capacitive sensor surfaces that trigger different functions through a manual actuation.

* * * * *